(12) United States Patent
Bessonov

(10) Patent No.: US 9,310,685 B2
(45) Date of Patent: Apr. 12, 2016

(54) METHOD AND APPARATUS FOR THE FORMATION OF CONDUCTIVE FILMS ON A SUBSTRATE

(71) Applicant: Nokia Technologies Oy, Espoo (FI)

(72) Inventor: Alexander Bessonov, Moscow (RU)

(73) Assignee: Nokia Technologies Oy, Espoo (FI)

( * ) Notice: Subject to any disclaimer, the term of this patent is extended or adjusted under 35 U.S.C. 154(b) by 289 days.

(21) Appl. No.: 13/892,782

(22) Filed: May 13, 2013

(65) Prior Publication Data

US 2014/0333916 A1 Nov. 13, 2014

(51) Int. Cl.
*G03F 7/20* (2006.01)
*G03F 7/004* (2006.01)
*G03F 7/40* (2006.01)

(52) U.S. Cl.
CPC ............ *G03F 7/2002* (2013.01); *G03F 7/0042* (2013.01); *G03F 7/40* (2013.01)

(58) Field of Classification Search
CPC ........ G03F 7/0042; G03F 7/2002; G03F 7/40
See application file for complete search history.

(56) References Cited

U.S. PATENT DOCUMENTS

| 7,674,636 B2 * | 3/2010 | Sundararajan et al. | 438/14 |
| 2009/0135383 A1 * | 5/2009 | Emoto | 355/30 |
| 2009/0274833 A1 * | 11/2009 | Li et al. | 427/123 |
| 2011/0233425 A1 | 9/2011 | Klokkenburg et al. | |
| 2012/0329209 A1 * | 12/2012 | Song et al. | 438/104 |
| 2013/0043221 A1 | 2/2013 | Hathaway et al. | |

FOREIGN PATENT DOCUMENTS

EP 2 317 831 A1 5/2011

OTHER PUBLICATIONS

Novacentrix, PulseForge Family of Tools [online] [retrieved Nov. 18, 2015]. Retrieved from the Internet: <URL: https://web.archive.org/web/20120617040129/http://www.novacentrix.com/products/pulseforge>. (dated Jun. 17, 2012) 2 pages.

(Continued)

*Primary Examiner* — Peter B Kim
*Assistant Examiner* — Michelle Iacoletti
(74) *Attorney, Agent, or Firm* — Alston & Bird LLP

(57) ABSTRACT

Provided herein are a method and apparatus for the formation of conductive films on a substrate using precise sintering of a conductive film and thermal management of the substrate during sintering. In particular, a method may include depositing a conductive metal-based ink on a translucent or transparent substrate, positioning a mask between the deposited conductive metal-based ink and a light source, exposing the mask and the underlying deposited conductive metal-based ink to the light source, sintering the conductive metal-based ink exposed to the light source, and cleaning the non-sintered conductive metal-based ink from the translucent or transparent substrate. The mask may be configured to shield at least a portion of the conductive metal-based ink from the light source. The portion of the conductive metal-based ink shielded from the light source may remain non-sintered in response to the sintering of the conductive metal-based ink exposed to the light source.

15 Claims, 6 Drawing Sheets

(56) References Cited

OTHER PUBLICATIONS

Xenon, Sintering Products [online] [retrieved Nov. 18, 2015]. Retrieved from the Internet: <URL: https://web.archive.org/web/20120910140109/http://www.xenoncorp.com/sintering_products.html>. (dated Sep. 10, 2012) 2 pages.

Drello, Model Overview [online] [retrieved Nov. 18, 2015]. Retrieved from the Internet: <URL:https://web.archive.org/web/20130311062428/http://www.hamamatsu.com/us/cn/product/category/1001/3024/index.html>. (dated Mar. 11, 2013) 2 pages.

Hamamatsu, Xenon Flash Lamp Modules [online] [retrieved Nov. 18, 2015]. Retrived from the Internet: <URL: https://web.archive.org/web/20130311062428/http://www.hamamatsu.com/us/en/product/category/1001/3024/index.html>. (dated Mar. 11, 2013) 2 pages.

* cited by examiner

METHOD AND APPARATUS FOR THE FORMATION OF CONDUCTIVE FILMS ON A SUBSTRATE

TECHNOLOGICAL FIELD

Some example embodiments of the present invention relate generally to the formation of conductive films on a substrate, and more particularly, to the patterned sintering of a conductive film on a substrate and the thermal management of the substrate.

BACKGROUND

In recent years, considerable progress has been made toward the development of thin and flexible displays, flexible electronic circuits, organic solar cells, etc. Each of these technologies benefit from highly conductive thin films patterned to be used as shunting electrodes, contacts, interconnects, etc. The thin film materials used may be printed to flexible plastic substrates to facilitate high throughput and low cost, both essential to the production of affordable electronics. However, films, such as those made with metal nanoparticle inks, typically show poor conductivity, poor adhesion, and poor mechanical stability when freshly printed thereby requiring post-deposition treatment to enhance their electrical and mechanical properties.

BRIEF SUMMARY

A method and apparatus are provided to enable improved formation of conductive films on a substrate through the precise sintering of a conductive film and thermal management of the substrate during sintering.

An example embodiment may provide a method including depositing a conductive metal-based ink on a translucent or transparent substrate, positioning a mask between the deposited conductive metal-based ink and a light source, exposing the mask and the underlying deposited conductive metal-based ink to the light source, sintering the conductive metal-based ink exposed to the light source, and optionally cleaning the non-sintered conductive metal-based ink from the translucent or transparent substrate. The mask may be configured to shield at least a portion of the conductive metal-based ink from the light source. The portion of the conductive metal-based ink shielded from the light source may remain non-sintered in response to the sintering of the conductive metal-based ink exposed to the light source. The mask may be configured to be positioned between one millimeter and ten millimeters above the deposited conductive metal-based ink. The conductive metal-based ink exposed to the light source may be sintered and include a first electrical conductivity. The portion of the conductive metal-based ink shielded from the light source may have a second electrical conductivity which is lower than the first electrical conductivity. The light source may include a visible light source with an emission spectrum of between about 200 nanometers and about 900 nanometers. The mask may include a gradient filter, where exposing the mask and the underlying deposited conductive metal-based ink to the light source may include causing a portion of the deposited conductive metal-based ink to become at least partially sintered in response to being partially shielded from the light source by the gradient filter. The gradient filter may include a gradient haze quartz mask. The method may optionally include providing a cooling stream of air proximate the translucent or transparent substrate.

Embodiments of the present invention may provide for an apparatus comprising a flash lamp, a reflector disposed about at least a portion of the flash lamp, where the reflector is configured to cooperate with the flash lamp to focus emitted energy from the flash lamp to a line on a substrate, and a blower configured to direct a cooling stream of air proximate the line on the substrate. The line on the substrate may be about 2 centimeters wide by about 25 centimeters long but not limited to this. The flash lamp may include a xenon flash lamp which may have a linear tube design and an emission spectrum of between about 200 nanometers and about 900 nanometers. The apparatus may also include a controller configured to control a pulse frequency, a pulse duration and an irradiation time of the flash lamp. The pulse frequency range may be about 1 Hertz to about 50 Hertz. The pulse duration range may be about 10 microseconds to about 5 milliseconds. The power range may be about 10 Watts to about 3000 Watts. The apparatus may further include a mask disposed between the flash lamp and the substrate, where the mask is configured to shield at least a portion of the substrate from the flash lamp. The mask may include a gradient light filter—where at least a portion of an emitted energy from the flash lamp is configured to pass through at least a portion of the gradient light filter. The gradient light filter may include a gradient haze quartz mask. The apparatus may optionally include a controller and temperature sensor, where the controller may be configured to adjust a flow rate of the cooling stream of air in response to a temperature sensed by the temperature sensor.

BRIEF DESCRIPTION OF THE DRAWINGS

Figure 1:
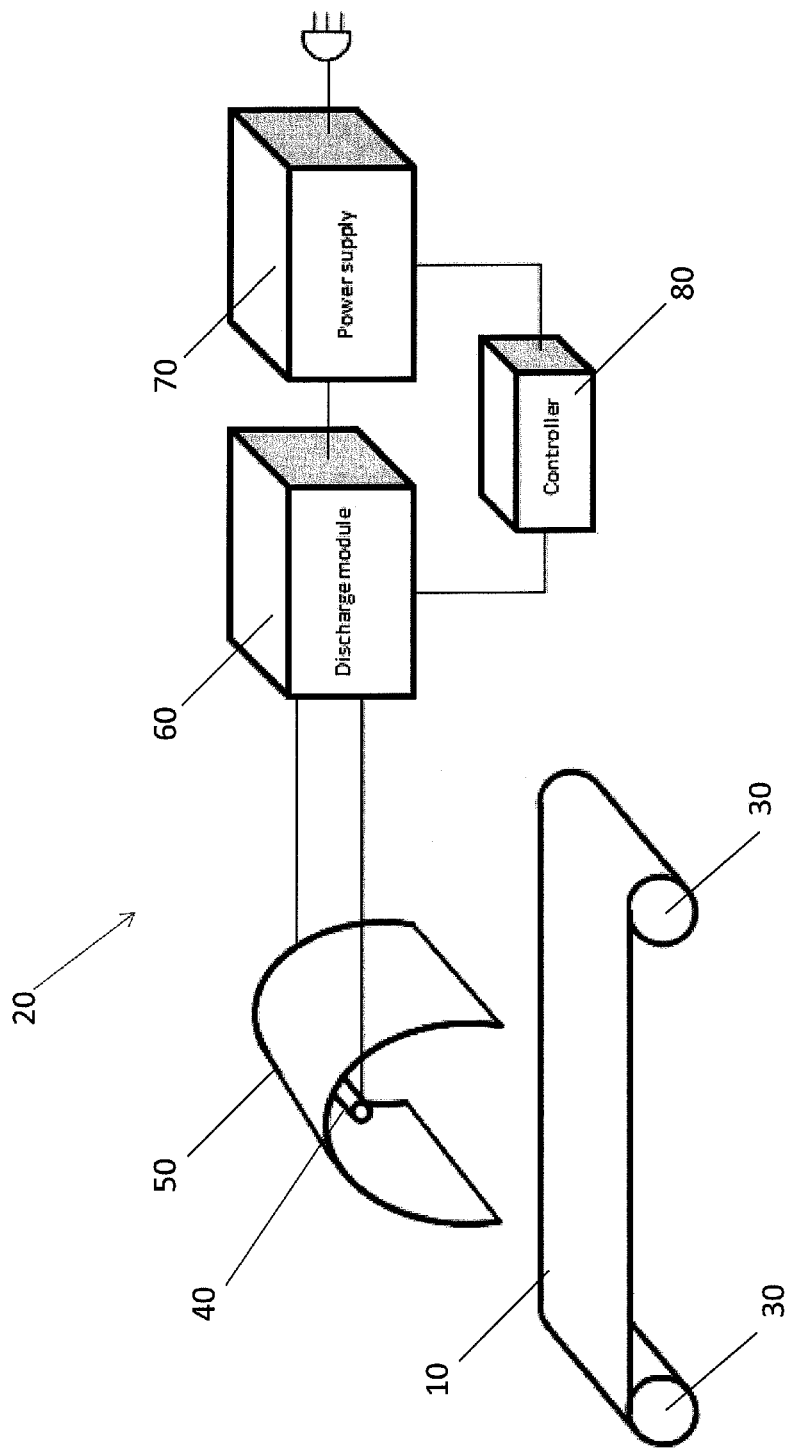
Figure 2:
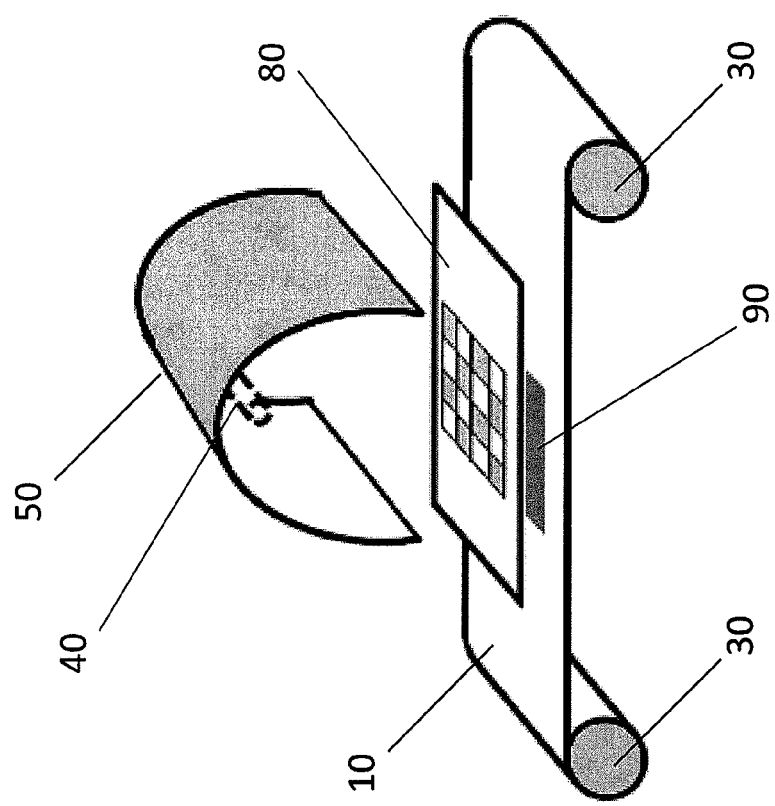
Figure 3:
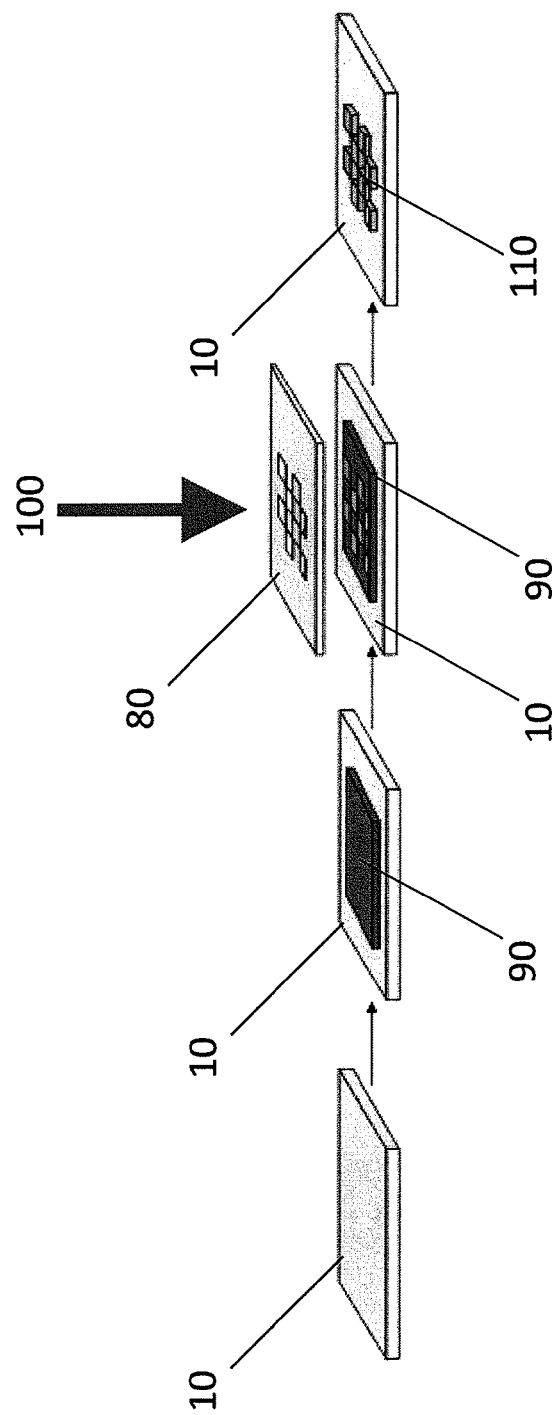
Figure 4:
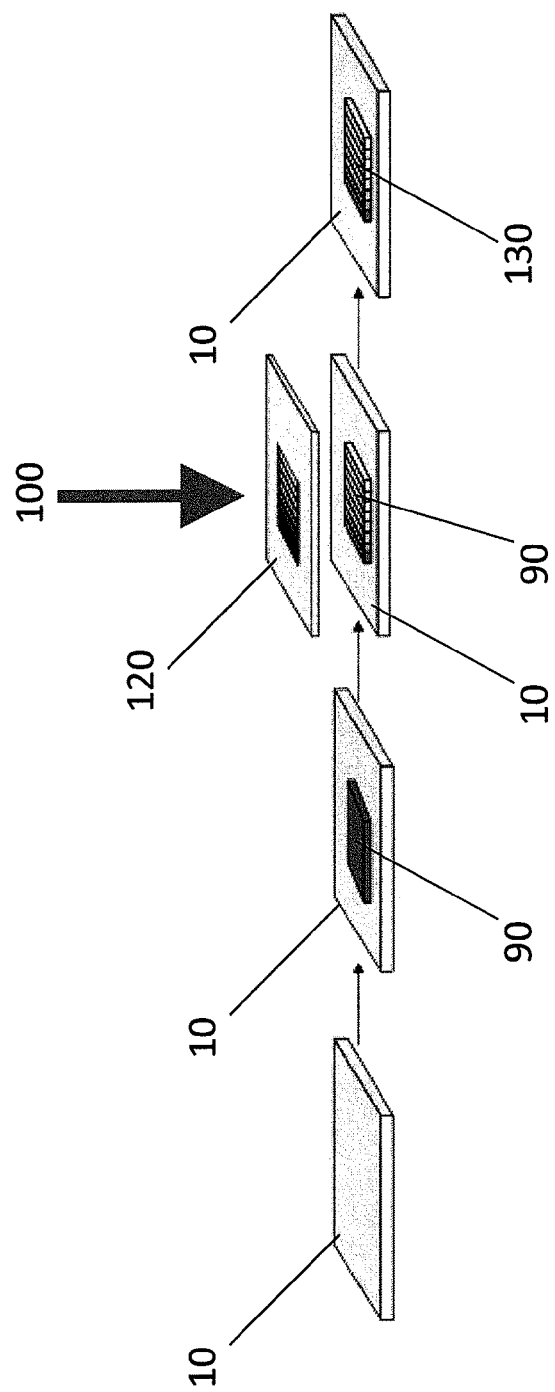
Figure 5:
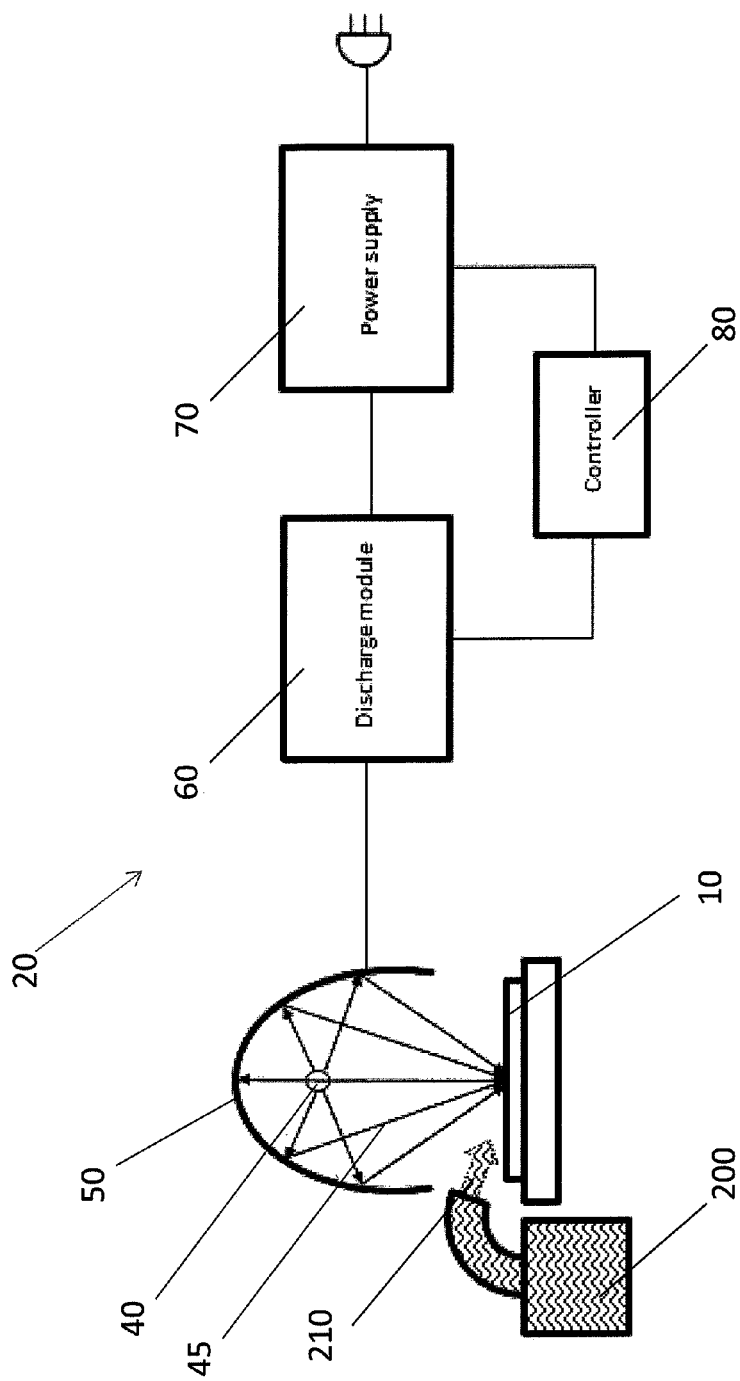
Figure 6:
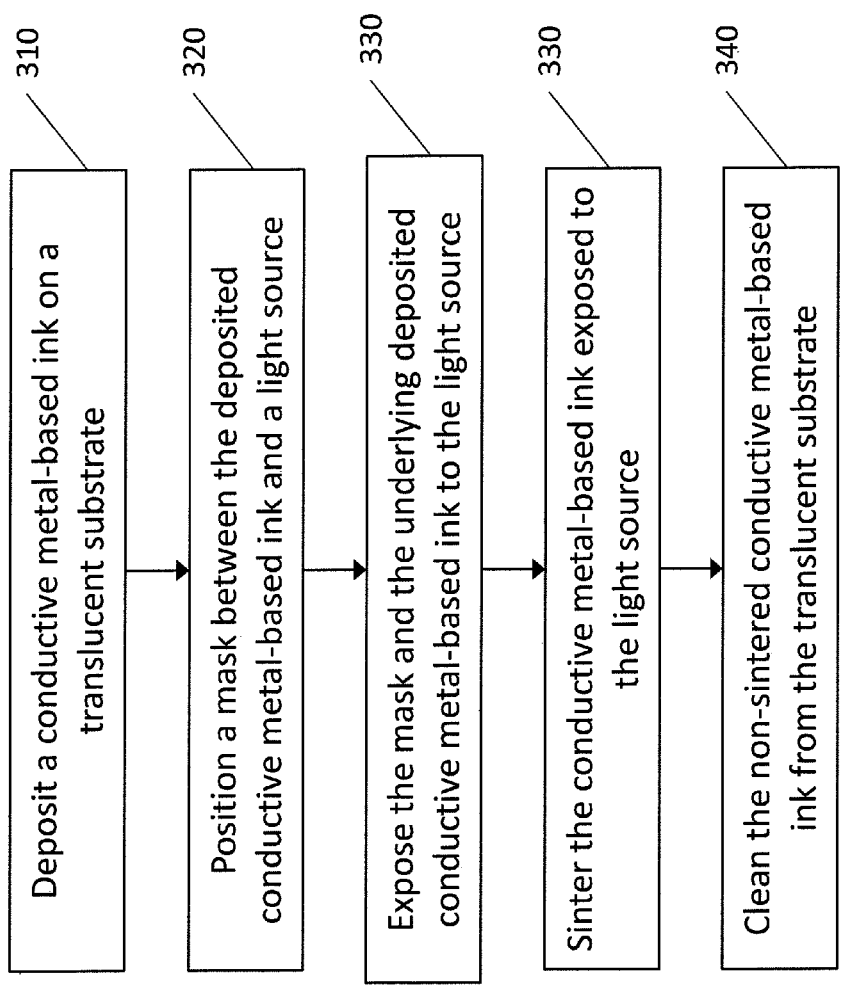

Having thus described embodiments of the invention in general terms, reference will now be made to the accompanying drawings, which are not necessarily drawn to scale, and wherein:

FIG. 1 is a schematic illustration of a system for photonic flash sintering of a metallic nanoparticle ink according to an example embodiment of the present invention;

FIG. 2 is an illustration of a system for photonic flash sintering using a photolithographic mask according to an example embodiment of the present invention;

FIG. 3 illustrates a process of photonic flash sintering using a photolithographic mask according to an example embodiment of the present invention;

FIG. 4 illustrates a process of photonic flash sintering using a photolithographic mask according to another example embodiment of the present invention;

FIG. 5 is a schematic illustration of a system for photonic flash sintering of a metallic nanoparticle ink and applying a cooling stream of air to the substrate according to an example embodiment of the present invention; and FIG. 6 is a flowchart of a method for photonic flash sintering of a metallic nanoparticle ink according to an example embodiment of the present invention.

DETAILED DESCRIPTION

Some embodiments of the present invention will now be described more fully hereinafter with reference to the accompanying drawings, in which some, but not all embodiments of the invention are shown. Indeed, various embodiments of the invention may be embodied in many different forms and should not be construed as limited to the embodiments set forth herein; rather, these embodiments are provided so that this disclosure will satisfy applicable legal requirements. Like reference numerals refer to like elements throughout.

Thus, use of any such terms should not be taken to limit the spirit and scope of embodiments of the present invention.

Some embodiments of the present invention may relate to provision of a mechanism to precisely sinter a conductive film deposited on a substrate using photonic flash sintering and a photolithographic or gradient hazed quartz mask for selective curing of metal nanoparticle inks on a flexible substrate. Embodiments may further provide for thermal management of the substrate temperature in order to avoid substrate deformation during the sintering process.

Conductive metal-based inks are used for the fabrication of printed electronics, such as organic light emitting diodes (OLED), flexible electronic circuits, radio frequency identification (RFID) tags, organic solar cells, etc. Conductive inks can be printed to flexible plastic substrates to allow high throughput and low cost production of flexible electronic components. Since freshly printed metal nanoparticle inks typically exhibit poor conductivity, adhesion, and mechanical stability, a post-deposition treatment may be used to enhance the electrical and mechanical properties. Generally, a heating oven, a hot plate, or an infrared (IR) heater may be used for sintering nanoparticles. However, photonic flash sintering may be used to more effectively and efficiently sinter the metal nanoparticles. Metal nanoparticle inks printed on plastic substrates may be photonically sintered into structures with high conductivity in a fraction of the time needed using conventional thermal processes. Since the sintering occurs much more rapidly under photonic flash sintering, fluid migration of the metal nanoparticle ink may be reduced allowing narrower lines with higher resolution.

The accuracy of printing of conductive inks is generally limited by the resolution of the printing device and the type of conductive ink used. Patterning of printed electronics may conventionally be carried out at the printing step with no ability to change the printed structure at a post-processing step such as sintering or curing. Printing with screen printing, gravure printing, and inkjet printing may not afford the resolution and accuracy necessary in small electronic components. However, with photonic flash sintering, particularly according to example embodiments using a photolithographic mask or hazed quartz mask to selectively cure the metal nanoparticle ink on the flexible substrate, the resolution may be greatly improved allowing for the creation of metal features directly on the flexible substrate with sizes approaching the visual light wavelength used for sintering.

FIG. 1 is a schematic illustration of a system for photonic flash sintering of a metallic nanoparticle ink according to an example embodiment of the present invention. The illustrated embodiment includes a substrate 10 upon which may be deposited (e.g., through printing) a metallic nanoparticle ink. The substrate may be stationary relative to the sintering system 20, or the substrate may be conveyed relative to the sintering system 20 as shown. In the illustrated embodiment, the substrate 10 is advanced between rolls 30 in a roll-to-roll process. The substrate rolls 30 may allow for rapid successive sintering of a plurality of electrical components in an efficient manner. The sintering system 20 may include a lamp, such as a xenon flash lamp 40 which may have an emission spectrum ranging from 200 nanometers to 900 nanometers. The lamp 40 may be selected based on the absorption spectrum of the metal nanoparticle ink. The lamp 40 may be partially surrounded by reflector 50 which may be elliptical or parabolic in shape and which may be configured to direct the emitted energy of the lamp 40 toward the substrate 10 as will be described further below. The lamp 40 may be driven by discharge module 60 which may be configured to provide the necessary electrical power to the lamp 40 at the prescribed frequency and duration as described further below. The system 20 may further include power supply 70 to provide power to the discharge module 60 and a controller 80 which controls the lamp 40 frequency, pulse duration and irradiation time by controlling the discharge module 60.

Embodiments of the present invention may provide a method of printing a pattern of a nanoparticle-based ink onto a substrate using any of a variety of printing methods such as screen printing, offset printing, reverse offset printing, gravure printing, flexography, dispensing, aerosol jet printing, inkjet printing, and the like. A variety of nanoparticle-based inks can be used for selective sintering including, but not limited to, silver, copper, nickel, etc. Any of a variety of polymer materials can be used as a substrate according to embodiments of the present invention including polyethylene terephthalate (PET), polyethylene naphthalate (PEN), polyether ether ketone (PEEK), polyethersulfone (PES), polyimide (PI), polyphenylene ether (PPE), polyurethane (PU), or polydimethylsiloxane (PDMS), for example. A post-deposition treatment may be applied using, for example, a xenon flash lamp in order to enhance the electrical and mechanical properties of the printed pattern. Photonic sintering selectively heats the nanoparticle ink through light absorption. Photonic flash sintering is a purely thermal process where heating occurs due to surface plasmon resonance phenomena of metal nanoparticles that show strong absorption bands in the same range of electromagnetic spectrum that the xenon flash lamp emits. As such, light is absorbed by the ink while conventional polymer substrates are transparent to the visible light. Heat is generated locally at the printed pattern resulting in selective heating of the printed ink while the lamp does not directly heat the substrate.

According to an example embodiment of the present invention, a xenon flash lamp sintering system may operate by pulsing the xenon flash lamp in a focused, narrow line. The lamp 40 may use a reflector 50 as shown in FIG. 1 to focus the emitted energy from the lamp 40 onto the substrate in a line that may be, for example 2 centimeters wide by 25 centimeters long. In this manner, high energy densities can be achieved locally in the targeted line. The nanoparticle ink may be heated to relatively high temperatures (e.g., 300 degrees Celsius or higher) by the surface plasmon resonance phenomenon of metal nanoparticles where the electrons of the metal nanoparticle ink are oscillated in response to stimulation by incident light. The heating of the ink may be achieved in fractions of a second.

In some example embodiments, the printing method of the nanoparticle ink may not provide the resolution necessary for the fabricated electronic component. In such an embodiment, a photolithographic mask may be used to sinter a portion of the printed nanoparticle ink in the pattern desired for the electronic component. FIG. 2 illustrates an example embodiment of a lamp 40 with reflector 50 of a sintering system (shown in FIG. 1) disposed above a substrate 10. The substrate 10 may include a printed pattern 90 which is a printed area of nanoparticle ink. A photolithographic mask 80 may be placed over the printed pattern of ink 90. The photolithographic mask 80 may include areas that are substantially transparent to the light emitted from the lamp 40 and other areas that are opaque to the light emitted from the lamp 40. In response to photonic flash sintering of the printed pattern 90 through the photolithographic mask 80, only those portions of the printed pattern 90 corresponding to the areas of the mask 80 that were transparent to the light emitted from the lamp 40 are sintered. The areas of the printed pattern 90 corresponding to the areas of the mask that are opaque to the light emitted from the lamp 40 remain un-sintered.

FIG. 3 illustrates a process of photonic sintering using a photolithographic mask 80 according to an example embodiment of the present invention. As shown, a substrate 10 is printed with a nanoparticle ink pattern 90. A photolithographic mask 80 is applied over the printed nanoparticle ink pattern 90 at between about 1 millimeter and 10 millimeters from the ink pattern 90. The visible light is emitted from the lamp and directed through the mask 80, along arrow 100, toward the ink pattern 90 on the substrate 10. The portions of the ink pattern 90 which are exposed to the light emitted from the lamp are sintered while the portions of the ink pattern 90 which were not exposed to the light emitted from the lamp are not sintered. The un-sintered portions of the ink pattern 90 may be optionally cleaned from the substrate 10 leaving a sintered pattern of nanoparticle ink 110. The sintered pattern 110 may have a significantly higher resolution than a pattern printed by conventional printing means.

FIG. 4 illustrates another example embodiment of a process of photonic sintering using a gradient light filter such as a gradient haze quartz mask which may be located between the light source and the printed pattern. The gradient light filter may include areas that are substantially transparent to visible light while other areas of the mask may be partially transparent, or filter visible light. Optionally, the gradient light filter may further include portions that are substantially opaque to visible light. In the illustrated embodiment, a substrate receives thereon a printed nanoparticle ink 90. The gradient light filter 120 is placed between the printed ink 90 and the light source. The gradient light filter 120 and the substrate 10 with the printed ink 90 thereon may be exposed to the light 100 from a light source (e.g., lamp 40 of FIG. 1). The hazed area of the gradient light filter 120 reduces the intensity of the pulsed light leading to a slower sintering rate of the ink in the area corresponding to the hazed area of the gradient light filter. In dependence of the hazing, ranging from 0% (transparent) up to about 90%, the light intensity can be filtered down to 10% of the initial value. As a result, the degree of curing or sintering of the printed nanoparticle ink 90 may be tailored to specific needs of electronic components. The varying degrees of sintering produced by photonic flash sintering where a printed pattern is covered by gradient light filter can produce an electronic component with varying degrees of electrical resistivity throughout the ink pattern.

The selective sintering processes described above can reduce the number of lithographic steps compared to conventional photolithography. Embodiments may be implemented in printing technologies as well as roll-to-roll manufacturing (as shown in FIGS. 1 and 2) for efficient production of electronic components.

Photonic flash sintering of nanoparticle ink may rapidly heat the ink to temperatures required to sinter the nanoparticle ink, often 300° C. or more. While transparent polymer substrates may allow the visible light from the lamp to pass through the substrate minimizing heat absorption, the heat transferred from the sintered nanoparticle ink to the substrate may be substantial. The dissipation of heat from the sintered nanoparticle ink through the transparent polymer substrate may lead to a loss of dimensional stability of the substrate. Loss of dimensional stability may include warping of the substrate which may degrade or destroy the integrity of the electronic component(s) disposed thereon. For example, polyethylene terephthalate (PET) and polyethylene naphthalate (PEN) generally have a glass transition temperature of 70-90° C. and 120-130° C. respectively, beyond which the substrates become dimensionally unstable. In some cases, a degradation of the polymer substrate may begin within a short time of irradiation, even in fractions of a second.

The process of heating the nanoparticle ink using photonic flash sintering is rapid and can be completed in only fractions of a second which leads to difficulties of controlling the sintering rate only using the power of illumination (e.g., the power with which the lamp is driven). Each type of metallic nanoparticle ink may have a different light absorption rate such that the sintering process may require optimization for each type of ink to achieve sufficient curing or sintering. Optical parameters such as the flash lamp frequency, pulse duration, and power may be optimized in dependence of the metallic nanoparticle ink to be sintered. Each of these variables must also be optimized in consideration of the substrate in the interest of minimizing dimensional instability. In an example embodiment in which multiple types of metallic nanoparticle inks are used in an electronic component, providing the photonic flash frequency, pulse duration, and power to cure one type of ink may cause another type of ink present to overheat the substrate. In such a case, it may be difficult to control the sintering process and minimize substrate dimensional instability only by varying the optical parameters such as the pulse energy, pulse frequency, pulse duration, light intensity, or irradiation time.

FIG. 5 illustrates an example embodiment of a system to help thermally manage the substrate temperature during the photonic flash sintering of the nanoparticle ink. The sintering system 20 includes the power supply 70, discharge module 60, and controller 80 as described with respect to FIG. 1. The system further includes the lamp 40 and reflector 50. As shown the lamp 40, together with the reflector 50 combine to direct the pulse energy 45 toward a finite location on the substrate 10. In order to thermally manage the substrate temperature, a forced air cooling unit 200 may be configured to direct a cooling stream of air 210 toward the location where the nanoparticle ink is being sintered. The cooling stream of air 210 may remove heat from the polymer substrate by virtue of the air being cooler than the substrate and the amount of heat removed may be controlled by the flow rate of the air stream, which may range from 0.1 cubic meters to about 20 cubic meters per minute. The stream of air may be introduced to the substrate from any angle above the substrate, or possibly from below the substrate when the substrate is either suspended at the position of photonic flash sintering or when the support for the substrate includes passages to allow cooling air to pass between the support and the substrate.

The cooling unit 200 may be controlled by the controller which is configured to adjust the air flow rate. The controller may be configured to read a substrate temperature from an area proximate the photonic flash sintering location through means such as non-contact infrared temperature sensor, or through other types of temperature sensors. The flow rate of the cooling unit 200 may be increased in response to an elevated temperature sensed at the area proximate the photonic flash sintering. In this manner, the controller 80 may control the cooling unit 200 thermostatically based upon the temperature of the substrate. In other embodiments, the cooling unit may be configured to provide a cooling stream of air before, during, and/or after the sintering process and for a predefined time before, during, and/or after the sintering process is complete.

FIG. 6 is a flowchart of techniques according to example embodiments of the invention. It will be understood that each block of the flowchart, and combinations of blocks in the flowchart, may be implemented by various means. Accordingly, blocks of the flowcharts support combinations of means for performing the specified functions and combinations of operations for performing the specified functions. It will also be understood that one or more blocks of the flowcharts, and combinations of blocks in the flowcharts, can be implemented by special purpose hardware-based computer systems which perform the specified functions, or combinations of special purpose hardware and computer instructions.

In this regard, a method according to one embodiment of the invention, as shown in FIG. 6, may include depositing a conductive metal-based ink on a translucent or transparent substrate as shown at 310, positioning a mask between the deposited conductive metal-based ink and a light source at 320, exposing the mask and the underlying deposited conductive metal-based ink to the light source at 330, sintering the conductive metal-based ink exposed to the light source at 330, and cleaning the non-sintered conductive metal based ink from the translucent or transparent substrate at 340.

In some embodiments, certain ones of the operations above may be modified or further amplified as described below. Moreover, in some embodiments additional optional operations may also be included. It should be appreciated that each of the modifications, optional additions or amplifications below may be included with the operations above either alone or in combination with any others among the features described herein. In some embodiments, a cooling stream of air may be provided proximate the translucent or transparent substrate.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions and the associated drawings describe some example embodiments in the context of certain example combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. A method comprising:
   depositing a conductive metal-based ink on a translucent substrate;
   positioning a mask between the deposited conductive metal-based ink and a light source, wherein the mask comprises a gradient light filter;
   exposing the gradient light filter mask and the underlying deposited conductive metal-based ink to the light source;
   causing the conductive metal-based ink exposed to the light source to become at least partially sintered in response to being partially shielded from the light source by the gradient light filter mask; and
   cleaning non-sintered conductive metal-based ink from the translucent substrate.

2. The method of claim 1, wherein the mask is configured to shield at least a portion of the conductive metal-based ink from the light source, and wherein the portion of the conductive metal-based ink shielded from the light source remains non-sintered in response to the sintering of the conductive metal-based ink exposed to the light source.

3. The method of claim 2, wherein the mask is configured to be positioned between one millimeter and ten millimeters above the deposited conductive metal-based ink.

4. The method of claim 2, wherein the conductive metal-based ink exposed to the light source is sintered and has a first electrical conductivity, and wherein the portion of the conductive metal-based ink shielded from the light source has a second electrical conductivity which is lower than the first electrical conductivity.

5. The method of claim 1, wherein the light source comprises a visible light source with an emission spectrum of between about 200 nanometers and about 900 nanometers.

6. The method of claim 1, wherein the gradient filter comprises a gradient haze quartz mask.

7. The method of claim 1, further comprising:
   providing for a cooling stream of air proximate the translucent substrate.

8. An apparatus comprising:
   a flash lamp;
   a reflector disposed about at least a portion of the flash lamp, wherein the reflector is configured to cooperate with a xenon flash lamp to focus emitted energy from the flash lamp to a line on a substrate;
   a mask positioned between the flash lamp and the substrate, wherein the mask is configured to shield at least a portion of the substrate from the flash lamp, wherein the mask comprises a gradient mask, and wherein at least a portion of an emitted energy from the flash lamp is configured to pass through at least a portion of the gradient mask; and
   a blower configured to direct a cooling stream of air proximate the line on the substrate.

9. The apparatus of claim 8, wherein the line on the substrate is about 2 centimeters wide by about 25 centimeters long.

10. The apparatus of claim 8, wherein the flash lamp comprises a xenon flash lamp having an emission spectrum of between about 200 nanometers and about 900 nanometers.

11. The apparatus of claim 8, further comprising a controller configured to control a pulse frequency, a pulse duration, and an irradiation time of the flash lamp.

12. The apparatus of claim 11, wherein a pulse frequency range is about 1 Hertz to about 50 Hertz.

13. The apparatus of claim 12, wherein a pulse duration range is about 10 microseconds to about 5 milliseconds.

14. The apparatus of claim 8, wherein the gradient mask comprises a gradient haze quartz mask.

15. The apparatus of claim 8, further including a controller and temperature sensor, wherein the controller is configured to adjust a flow rate of the cooling stream of air in response to a temperature sensed by the temperature sensor.

* * * * *